United States Patent [19]
Chen

[11] Patent Number: 5,712,206
[45] Date of Patent: Jan. 27, 1998

[54] METHOD OF FORMING MOISTURE BARRIER LAYERS FOR INTEGRATED CIRCUIT APPLICATIONS

[75] Inventor: Chung-Zen Chen, Hsinchu, Taiwan

[73] Assignee: Vanguard International Semiconductor Corporation, Hsin-Chu, Taiwan

[21] Appl. No.: 618,617

[22] Filed: Mar. 20, 1996

[51] Int. Cl.$^6$ .................................................. H01L 21/70
[52] U.S. Cl. ........................ 438/601; 438/540; 257/529; 148/DIG. 55
[58] Field of Search ................... 437/60, 191, 192, 437/193, 195, 246, 972; 148/DIG. 55; 257/529

[56] References Cited

U.S. PATENT DOCUMENTS

| | | | |
|---|---|---|---|
| 4,536,949 | 8/1985 | Takayama et al. | 29/578 |
| 5,017,510 | 5/1991 | Welch | 437/192 |
| 5,578,517 | 11/1996 | Yoo et al. | 437/60 |
| 5,585,662 | 12/1996 | Ogawa | 257/529 |
| 5,585,663 | 12/1996 | Bezama et al. | 257/529 |

*Primary Examiner*—John Niebling
*Assistant Examiner*—Joni Y. Chang

*Attorney, Agent, or Firm*—George O. Saile; Stephen B. Ackerman; William J. Stoffel

[57] ABSTRACT

The structure and method is provided which prevents moisture and contamination from diffusing through openings (e.g., fuse windows) in insulating layers to product devices. Three moisture barrier layers form a moisture impervious boundary system to prevent moisture from diffusing from a fuse window into other overlying layers and into product devices. First and second barrier layers are formed insulation layers below the fuse. A third barrier layer is formed over an uppermost insulation layer, the sidewalls of a fuse window and over the fuse. The first and third barrier layers form a seal in the fuse area. The method comprises forming an insulating layer 52 54 over portions of said substrate 50 including in said fuse window area 63. A first barrier layer 56, a first interlevel dielectric layer 58 are formed over the insulating layer. A second barrier layer 60 is formed over said first interlevel dielectric layer 58. Then a fuse 62 and overlying insulating and conductive layers 66 70 are formed over said fuse 62. Next, a fuse window 73 is formed through said insulating and conductive layers exposing the fuse and the first barrier layer. A third barrier layer 72 is formed over the fuse window, the fuse and the first barrier layer in the fuse window area.

21 Claims, 5 Drawing Sheets

*FIG. 1A - Prior Art*

METHOD OF FORMING MOISTURE BARRIER LAYERS FOR INTEGRATED CIRCUIT APPLICATIONS

BACKGROUND OF INVENTION

1) Field of the Invention

This invention relates to integrated circuits and semiconductor devices. It relates particularly to a structure and method for producing integrated circuits having moisture and contamination barrier layers surrounding openings in insulating layers, such as fuse openings.

2) Description of the Prior Art

Fuses can be used to rewire memory and logic circuits. For example, in dynamic or static memory chips, defective memory cells may be replaced by blowing fuses associated with the defective cells, and then activating a spare row or column of cells. This circuit rewiring using fusible links allows considerable enhanced yields and reduces the production costs. Also, logic circuits may also be repaired or reconfigured by blowing fuses. For example, it is common to initially fabricate a genetic logic chip having a large number of interconnected logic gates. Then, in a final processing step, the chip is customized to perform a desired logic function by disconnecting the unnecessary logic elements by blowing the fuses that connect them to the desired circuitry. Still other applications for laser-blown fuses are possible.

An important challenge is to improve the reliability and yields of the semiconductor devices surrounding openings in insulating layers, such as openings over fusible links. A problem with the openings is that moisture and other contaminants can diffuse from the sidewalls of the openings into the device areas thus reducing circuit reliability and yields.

FIG. 1A shows a top plan view of a semiconductor chip 14 with openings through the insulating layers called fuse windows 12. Also, a semiconductor chip 14 sometimes contains openings 12 over alignment marks which are used to align the laser repair machine and other tools.

Fuses are often formed over thick field oxide regions in semiconductor substrate. Fuses are formed over the field oxide regions to prevent shorting of the fuse to the substrate through a thinner insulating layer during a laser burning process. Openings in the insulating layers, called fuse windows 12, are formed over the fuse widow area through the insulating layers overlying the fuse.

There are two common methods for blowing fuses: (a) using a laser to melt the fuse and (b) passing a high current through the fuse. The portion of the fuse which is melted away or "blown" must not deposit or interfere with nearby devices. In addition, openings are often formed over alignment marks which are used to align the laser on the correct portion of the fuse to be blown. The alignment mark openings in the passivation layers are formed so that the alignment marks can be clearly viewed.

A major problem with any window opening in the passivation layers is that moisture and contamination can enter through the exposed insulation layers in the window opening and diffuse to the semiconductor devices. Moreover, when the fuse is blown by the laser or high current, a hole is often formed in the insulation layers under the fuse. Moisture and contamination can enter these holes and diffuse to nearby devices thereby causing problems.

The diffused moisture and contaminates can decrease reliability and yields when they diffuse to devices. Moisture is present in the air and sodium (Na+ions) is plentiful in the environment. For example, water will attack the metal via, with the following reaction:

$$3H_2O + Al \rightarrow Al(OH)_3 + \tfrac{3}{2}H_2$$

causing the resistance of metal vias to increase and finally cause circuit failure. Mobile ions, such as sodium ions, can diffuse through insulating layers and field oxide layer. Mobile ions in the field oxide layer can cause field inversion. The field inversion causes undesired leakage current between adjacent buried source/drain regions. Also, mobile ions in the gate oxide will cause a transistor threshold shift whereby the circuit fails. Furthermore, moisture can cause the insulating layers to delaminate causing circuit failure.

The following U.S. patent shows a fusible link structure, but do not solve the problem of moisture diffusing through the window opening and the insulating layers. U.S. Pat. No. 4,536,949 to Takayama et al. discloses a technique whereby an accurate fuse window is opened in insulating layers above the fuse. However, the problem of contaminants diffusing to the semiconductor devices through the fuse window still exists.

SUMMARY OF THE INVENTION

It is a general object of the invention to provide an improved structure and method for forming an integrated circuit moisture barrier which prevents contamination/moisture from diffusing from an opening (e.g., window) in insulating layers to device areas.

A more specific object of the present invention is to provide an improved structure and method for forming an integrated circuit moisture barrier which prevents moisture from diffusing through an opening in the insulating layers over a fuse to semiconductor devices.

In accordance with the above objects, a structure and technique for forming an moisture barrier for an integrated circuit is provided. The invention provides a structure and a method for forming a moisture barrier which confines the path of moisture penetration in integrated circuits. This is especially applicable to integrated circuits which have fuse windows or other openings, such as alignment mark openings, through the insulation layers.

The method of the present invention for forming a moisture barrier for an integrated circuit begins by providing a substrate having a fuse window area 63 and device areas 65. Later a fuse and a fuse window will be formed through the layers overlying the fuse in the fuse window area. The method comprises the following steps. A field oxide region is formed over portions of the substrate including the fuse window area. A first insulating layer is formed over the field oxide layer and the substrate. A first barrier layer is formed over the first insulating layer 54. A first interlevel dielectric layer is formed over the first barrier layer. A second barrier layer is formed over the first interlevel dielectric layer. A fuse is formed over the second barrier layer at least across the fuse window area. Then a second interlevel dielectric layer is formed over the fuse and the second barrier layer and the second interlevel dielectric layer is patterned to form vias exposing the fuse. A first metal layer is formed over the second interlevel dielectric layer and in the vias. An inter metal dielectric layer and a first passivation layer are formed over the first metal layer. A fuse window is etched though the second interlevel dielectric layer, the inter metal dielectric layer, and a first passivation layer to expose the fuse in the fuse window area. A third barrier layer is formed over the first passivation layer and over the sidewalls of the fuse window and the exposed fuse. The third barrier layer forms a moisture proof seal with the second barrier layer.

The structure of the moisture barrier system for an integrated circuit of the present invention can be summarized as follows. Three moisture barrier layers and the substrate form a moisture impervious boundary preventing moisture from diffusing from a fuse window into other overlying layers and into product devices. The first and second barrier layer are formed on insulation layers below the fuse. A third barrier layer is formed over an uppermost insulation layer, the sidewalls of a fuse window and over the fuse. The first and second barrier layers form a seal in the fuse area.

A preferred embodiment of the structure of the moisture barrier for an integrated circuit of the present invention can be described as follows. A substrate having a fuse window area and device areas is provided. A field oxide region (FOX), a first insulating layer, a first barrier layer composed of a moisture impermeable material, and a first interlevel dielectric layer are formed over portions of the substrate including the fuse window area. A first interlevel dielectric layer, a first barrier layer, a first interlevel dielectric layer, a second barrier layer and a fuse are provided over a first interlevel dielectric layer at least across the fuse window area. A second interlevel dielectric layer is furnished over the fuse and the second barrier layer. The second interlevel dielectric layer has vias that expose the fuse. A first metal layer overlies the second interlevel dielectric layer and fills the vias. An inter metal dielectric layer and a first passivation layer overlie the first metal layer. A fuse window extends through the first interlevel dielectric layer, the second interlevel dielectric layer, the inter metal dielectric layer, and the first passivation layer in the fuse window area and exposes the fuse. A third barrier layer blankets the first passivation layer, the sidewalls of the fuse window, the exposed fuse, and the exposed first barrier layer. The third barrier layer forms a moisture proof seal with the first barrier layer in the fuse window area.

The moisture barrier system of the present invention provides three barrier layers that control the path of moisture so that moisture is prevented from diffusing to product areas near the fuse window. The first (bottom) and second (middle) moisture barriers prevent moisture and contamination that enters the layers beneath the barrier layers, from penetrating to the layer above the barrier layers. Also, the seal between the first barrier layer and the third top barrier layer prevent moisture from penetrating from the fuse window into layers above the second barrier layer. The invention provides a cost effective approach to preventing moisture from entering the fuse openings and from penetrating into device areas. Not all three barrier layers are necessary to implement the invention and provide an effective barrier system.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A is a top plan view in greatly enlarged scale that illustrates a semiconductor chip with fuse openings in accordance with the prior art.

DETAILED DESCRIPTION OF THE PREFERRED EMBODIMENTS

Figure 6:
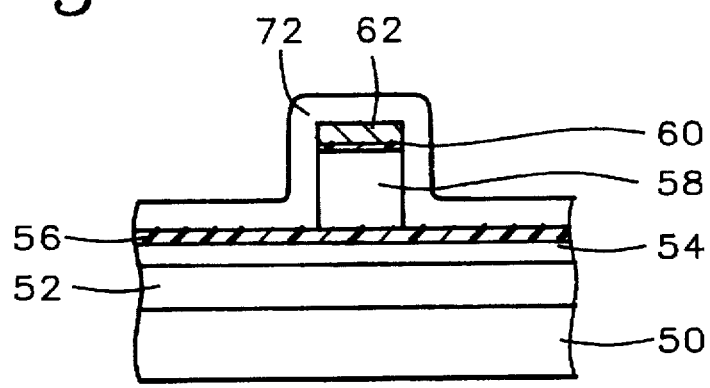
FIG. 6 is a cross sectional view take along axis B/B' in FIG. 1B that illustrates an embodiment of method for forming the moisture barrier system of the present invention.
Figure 7:
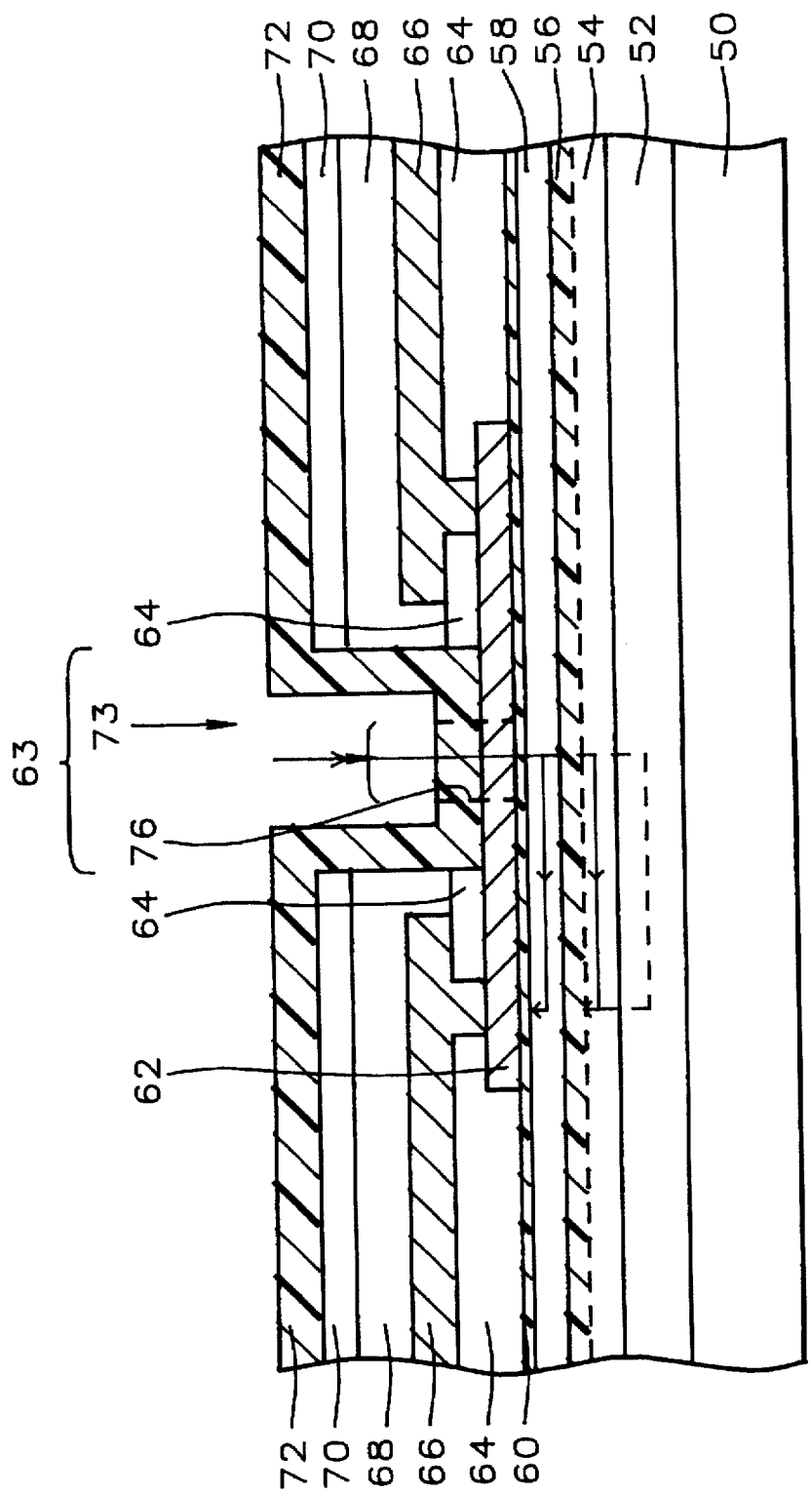
FIG. 7 is a cross sectional view take along axis A/A' in FIG. 1B that illustrates an embodiment of method for forming the moisture barrier system of the present invention.

The following detailed description relates to a structure and method for forming a moisture barrier system for integrate circuits. Described below is a preferred embodiment of the moisture barrier system of an integrated circuit. As shown in FIGS. 6 and 7, a preferred embodiment has three moisture impermeable barrier layers 56 60 72. The system comprises: a bottom barrier (1st) layer 56 below the fuse 62, a middle (2nd) barrier layer 60 over the first barrier layer but under the fuse, and a top (third) barrier layer 72 which is over the fuse 62, the sidewalls of the fuse window 73 and the upper insulating layers 64 66 68 70. The barrier layers 56 60 72 confine the diffusion path of moisture that can enter through the laser repair hole in the barrier layers 72 60 56 or insulation layers 58. It is understood by those skilled in the art that other combinations for insulating and conductive layers can be formed under, between and over the barrier layers. Other embodiments of the invention can have less than three barrier layers. Also, the term "about" when used in stating a value or range (e.g., in the range of between about 1 and 2) means a tolerance of plus/minus 10%.

Figure 1B:
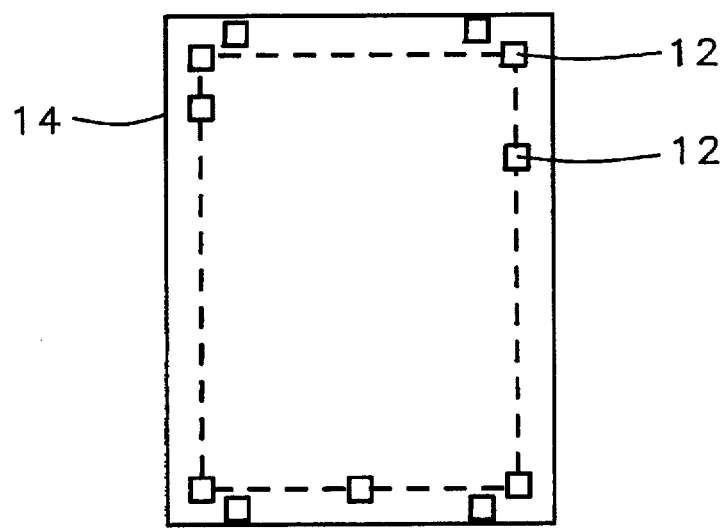
FIG. 1B is a top plan view in greatly enlarged scale that illustrates the an embodiment of the method for forming the moisture barrier system of the present invention.
Figure 1B:
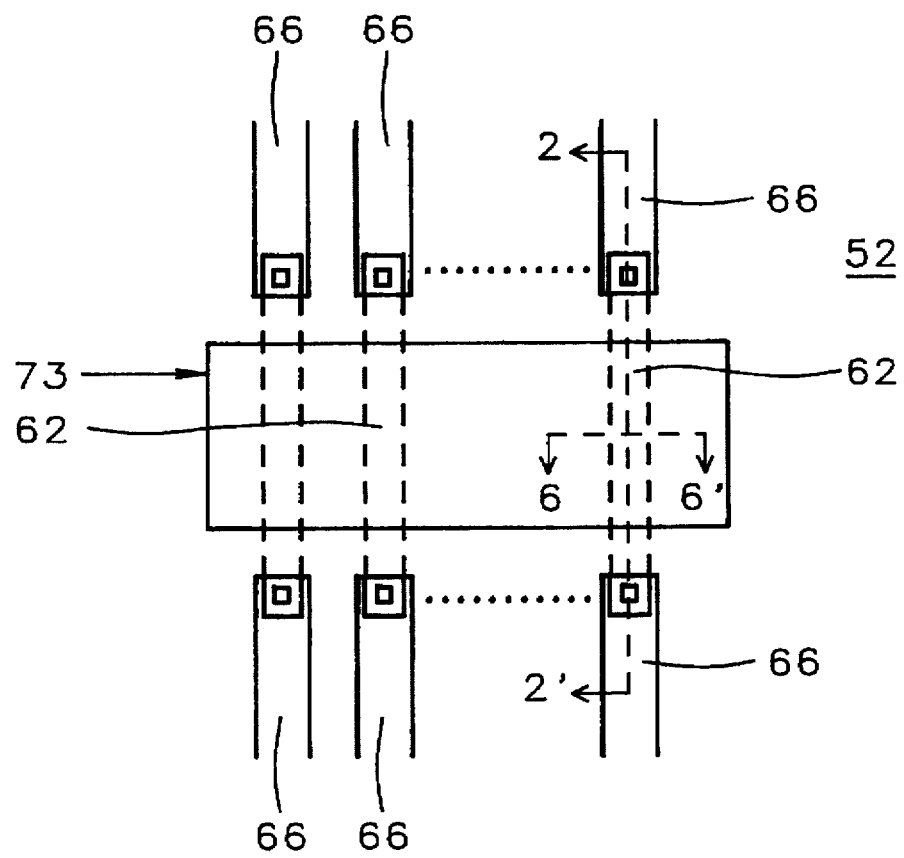
Figure 2:
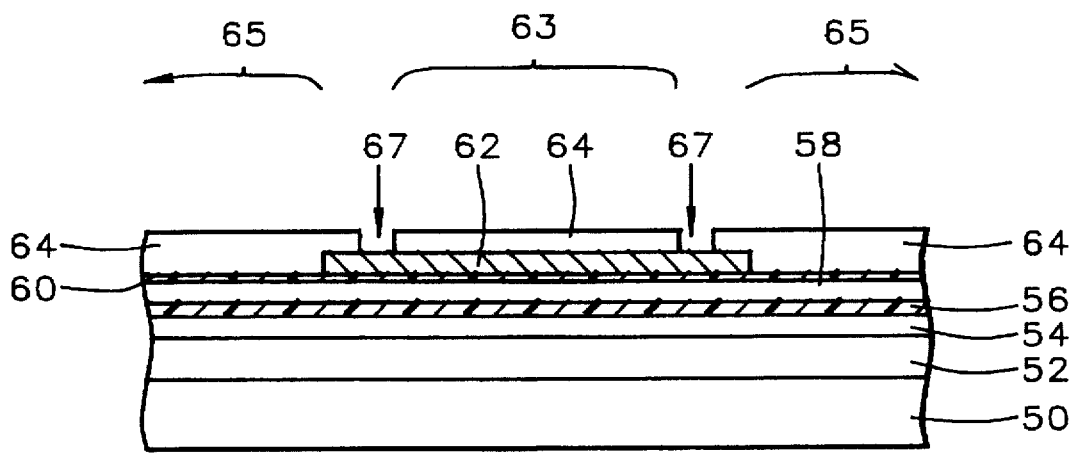
FIGS. 2–5 are a cross sectional views take along axis A/A' in FIG. 1B that illustrate an embodiment of method for forming the moisture barrier system of the present invention.

A preferred embodiment of the method of the present invention for forming a moisture barrier for an integrated circuit begins by providing a substrate 50 having a fuse window area 63 and device areas 65 as shown in FIGS. 1b and 2. The fuse window area 63 is an area where a fuse window will subsequently be formed. The substrate is preferably a p-doped silicon wafer with a (1,0,0) crystal orientation. The term "substrate" is understood to possibly include a semiconductor wafer, active and passive devices formed within the wafer, and layers (i.e., insulation and conductive layers) formed on the wafer surface.

FIG. 1B shows a top down view of fuse window 73 of the current invention. Fuses 62 are formed on a field oxide 52 across the fuse window 73. Metal lines 66 connect to the fuses 62. The fuses 62 are burnt open in the fuse window 73, preferably by a laser or a high current.

As shown in FIG. 2, the substrate has a fuse window area 63 where a fuse window 73 (see FIGS. 1B and 5) will subsequently be formed. Also the substrate 50 has devices areas 65, outside the fuse window area 63, where semiconductor devices, such as field effect transistors (FET), metal lines, etc., can be formed.

Still referring to FIG. 2, a field oxide region 52 (FOX) is formed over portions of the substrate 50 including the fuse window area 63. One method of forming these regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface in the unmasked areas. The mask is removed and semiconductor devices can be formed in the openings between the isolation regions. The preferred thickness of the field oxide is preferably in the range between about 3000 and 5000 Å.

A first insulating layer 54 (C1 TEOS) is formed over the field oxide layer 52 and the substrate. The first insulating layer 54 preferably has a thickness in the range of about 1000 and 2000 Å and more preferably a thickness of about 1500 Å. The first insulating layer 54 is preferably formed of a silicon oxide formed by a conventional TEOS (tetraethylorthosilicate) deposition process.

Subsequently, a first barrier layer 56 (SiN or ONO) (or bottom barrier layer) is formed over the first insulating layer 54. The first barrier layer is optional. The first barrier layer 56 is formed of moisture impervious materials, such as silicon nitride, or a three film structure of silicon oxide/ silicon nitride/silicon oxide (ONO). The first barrier layer 56 is preferably formed of silicon nitride or ONO. The first barrier layer 56 is more preferably composed of a silicon nitride. The first barrier layer 56 preferably has an overall thickness in the range of between about 200 and 600 Å. The minimum thickness is limited by the quality of the silicon nitride layer and must be thick enough to be moisture proof. The upper limit is constrained only by practical limits in that the thinner the layer, the more miniaturized and faster the chip.

A barrier layer composed of SiN can be formed by reacting silane and ammonia at atmospheric pressure at 700° to 900° C., or by reacting dichlorosilane and ammonia at reduced pressure at approximately 700° C. Also, silicon nitride can be formed by plasma enhance chemical vapor deposition by reacting silane with ammonia or nitrogen in a glow discharge between 200° and 350° C. The nitride layer can have a thickness in the range of between about 200 and 500 Å. The first barrier layer 56 is also preferably composed of a three film structure of silicon oxide/silicon nitride/ silicon oxide and has an overall thickness in the range of between about 300 and 600 Å. The nitride layer in the ONO structure preferably has a thickness in the range of between about 200 and 500 Å.

A first interlevel dielectric layer 58 (ILD1) is then formed over the first barrier layer 56. The first interlevel dielectric layer 58 (ILD1) is preferably composed of borophosphosilicate glass (BPSG), Tetraethylorthosilicate (TEOS) oxide and is more preferably formed of BPSG. The first interlevel dielectric layer 58 preferably has a thickness in the range between about 3000 and 5000 Å.

A second barrier layer 60 is formed over the first interlevel dielectric layer 58. The second barrier layer 60 is preferably composed of silicon nitride or ONO. The second barrier layer 60 preferably has thickness in the range between about 200 and 500 Å and more preferably about 300 Å. A second barrier layer composed of silicon nitride can be formed with the processes (described above) used to form the first barrier layer.

Still referring to FIG. 2, a fuse 62 is formed over the second barrier layer 60 (SiN) at least across the fuse window area 63. The fuse 62 is preferably composed of aluminum or titanium tungsten, a silicide, such as tungsten silicide, platinum silicide, polysilicon, or a polycide, such as titanium polycide, tungsten polycide or molybdenum polycide and is more preferably formed of tungsten silicide. The fuse 62 preferably has a thickness in the range of between about 1500 and 2500 Å.

A second interlevel dielectric layer 64 (ILD2) is formed over the fuse 62 and the second barrier layer 60. The second interlevel dielectric layer 64 is patterned using conventional photo-etch techniques to form vias 67 exposing the fuse 62 as shown in FIG. 2. The second interlevel dielectric layer 64 (ILD2) is preferably composed of borophosphosilicate glass (BPSG). The layer preferably has a thickness in the range between about 3000 and 5000 Å and a thickness more preferably of about 4000 Å.

Figure 3:
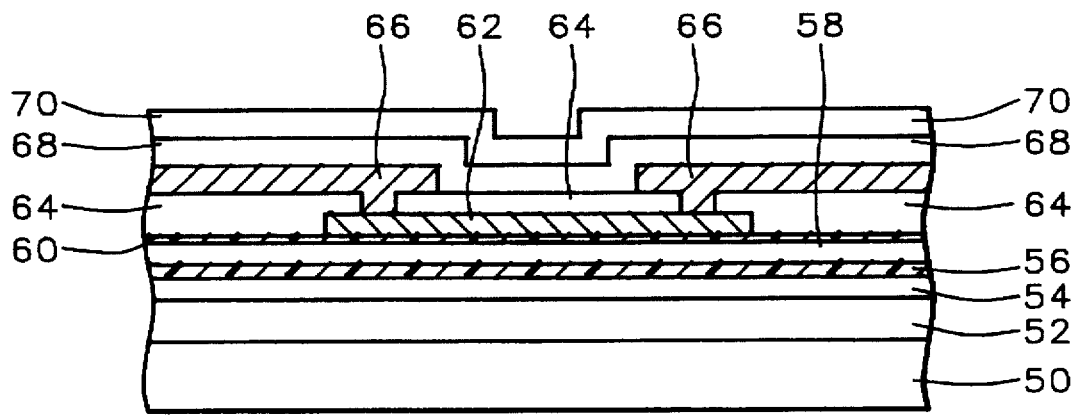

Referring to FIG. 3, a first metal layer 66 is formed over the second interlevel dielectric layer 64 and in the vias 67. The first metal layer 66 is preferably formed of: a metal, such as AlSiCu and AlCu, or a four film structure consisting of (1) a first titanium layer, (2) a titanium nitride layer, (3) an aluminum silicon copper layer and (4) an anti-reflective coating (ARC) titanium nitride layer The first metal layer 66 is preferably composed of a four film structure consisting of (1) a first titanium layer, (2) a titanium nitride layer, (3) an aluminum silicon copper layer and (4) an anti-reflective coating (ARC) titanium nitride layer. The first metal layer can also be made using a plug process (e.g., a plug in the via and an overlying metal layer). The four film structure can be implemented with a plug process. The first metal layer preferably has an overall thickness in the range between about 4000 and 7000 Å and more preferably of about 5000 Å.

An inter metal dielectric layer 68 and a first passivation layer 70 are then formed over the first metal layer 66. The inter metal dielectric layer 68 is preferably composed of a three layer sandwich structure of silicon oxide or spin on glass and silicon oxide. The preferred process to form the inter metal dielectric layer 68 is to form a silicon oxide layer by a plasma enhanced process (PEOX) with a thickness in the range of between about 3000 and 5000 Å and form an overlying SOG layer with a thickness in the range of between about 3000 and 5000 Å. Then the SOG layer is etched back to remove the SOG layer above the level of the first metal layer 66. The inter metal dielectric layer 68 preferably has an overall thickness in the range of between about 3000 and 5000 Å and more preferably of about 4000 Å.

The first passivation layer 70 is preferably composed of silicon oxide. The silicon oxide is preferably made by a Plasma Enhanced (PE) oxidation process. The first passivation layer preferably has a thickness in the range between about 1000 and 3000 Å.

Figure 4:
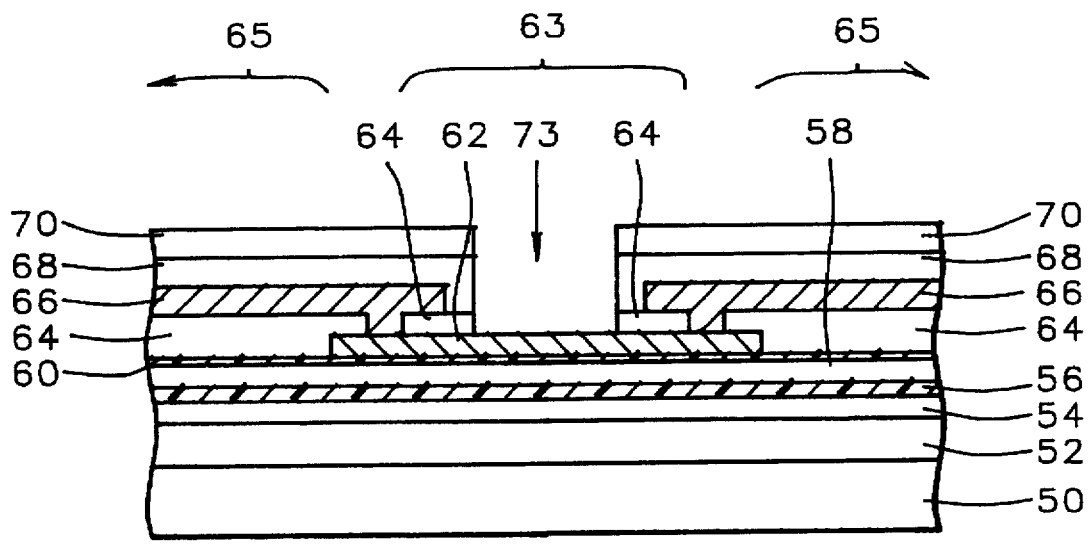

Referring to FIG. 4, a fuse window 73 is then etched though the second interlevel dielectric layer 64, the inter metal dielectric layer 68, and a first passivation layer 70 to expose portions of the fuse 62 in the fuse window area 63. The etch also removes portions of the second barrier layer 60 and the first inter level dielectric layer 58 in the fuse window 73 as shown in FIG. 6 (a cross sectional view through axis B/B' of FIG. 1B). The fuse window is preferably formed by a conventional photo-etch process.

Figure 5:
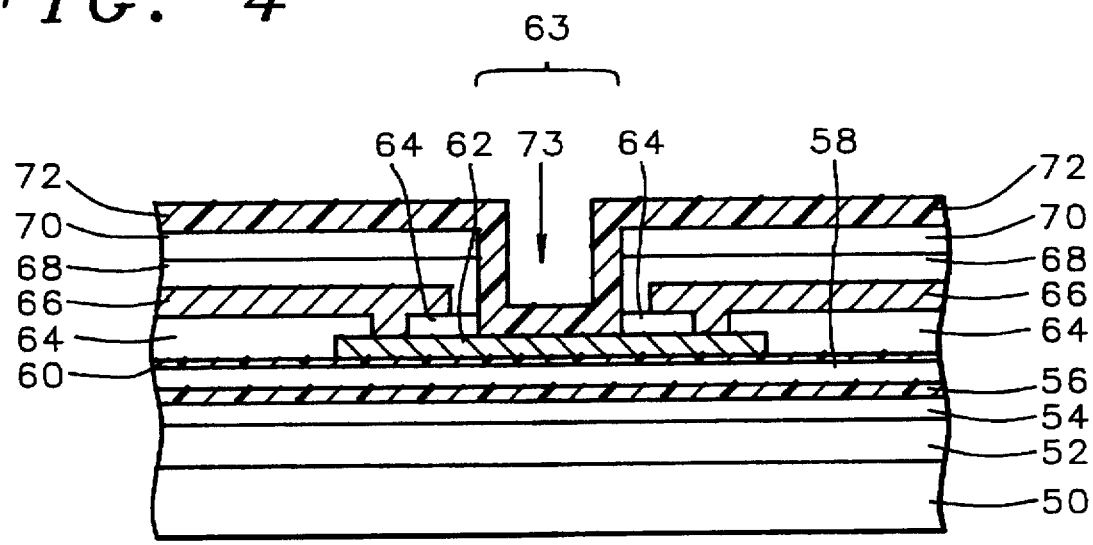

Turning to FIG. 5, a third barrier layer 72 (i.e., second passivation layer) is formed over the first passivation layer 70 and over the sidewalls of the fuse window 73 and the exposed fuse 62. The third barrier layer 72 forms a moisture proof seal with the first barrier layer 56 in the fuse window area as shown in FIG. 6. The third barrier layer 72 is preferably composed of silicon nitride. The third barrier layer 72 preferably has a thickness in the range between about 5000 and 10,000 Å and more preferably about 7000 Å.

FIG. 6 shows a cross sectional view of a portion of the fuse window viewed along axis B/B' as shown in FIG. 1B. The third barrier layer 72 forms a moisture proof seal with the first barrier layer 56 in the fuse window area.

FIGS. 5, 6, and 7, show the structure for an embodiment of the moisture barrier system for an integrated circuits of the present invention. The structure comprises: a substrate having a fuse window area 63 and device areas 65; a field oxide region 52 (FOX) over portions of the substrate including the fuse window area 63; a first insulating layer 54 over the field oxide layer 52 and the substrate; a first barrier layer 56 composed of a moisture impervious material (SiN or ONO) over the first insulating layer 54; a first interlevel dielectric layer 58 over the first barrier layer 56; a second barrier layer 60 composed of a moisture impervious material over the first interlevel dielectric layer 58; a fuse 62 over the second barrier layer (SiN) at least across the fuse window area; a second interlevel dielectric layer 64 (ILD2) over the fuse 62 and the second barrier layer 60; and the second interlevel dielectric layer 64 having vias that expose the fuse 62; a first metal layer 66 over the second interlevel dielectric layer 64 and in the vias; an inter metal dielectric layer 68 and a first passivation layer 70 over the first metal layer; a fuse window 73 though the first interlevel dielectric layer, the second interlevel dielectric layer 64, the inter metal dielectric layer 68, and a first passivation layer 70 not covering the fuse 62 in the fuse window area 63; the fuse window 73 having vertical sidewalls; and a third barrier layer 72 composed of a moisture impervious material over the first passivation layer 70 and over the sidewalls of the fuse window and the exposed fuse 62; the third barrier layer forming a moisture proof seal with the first barrier layer 56 in the fuse window area 63.

Figure 8:
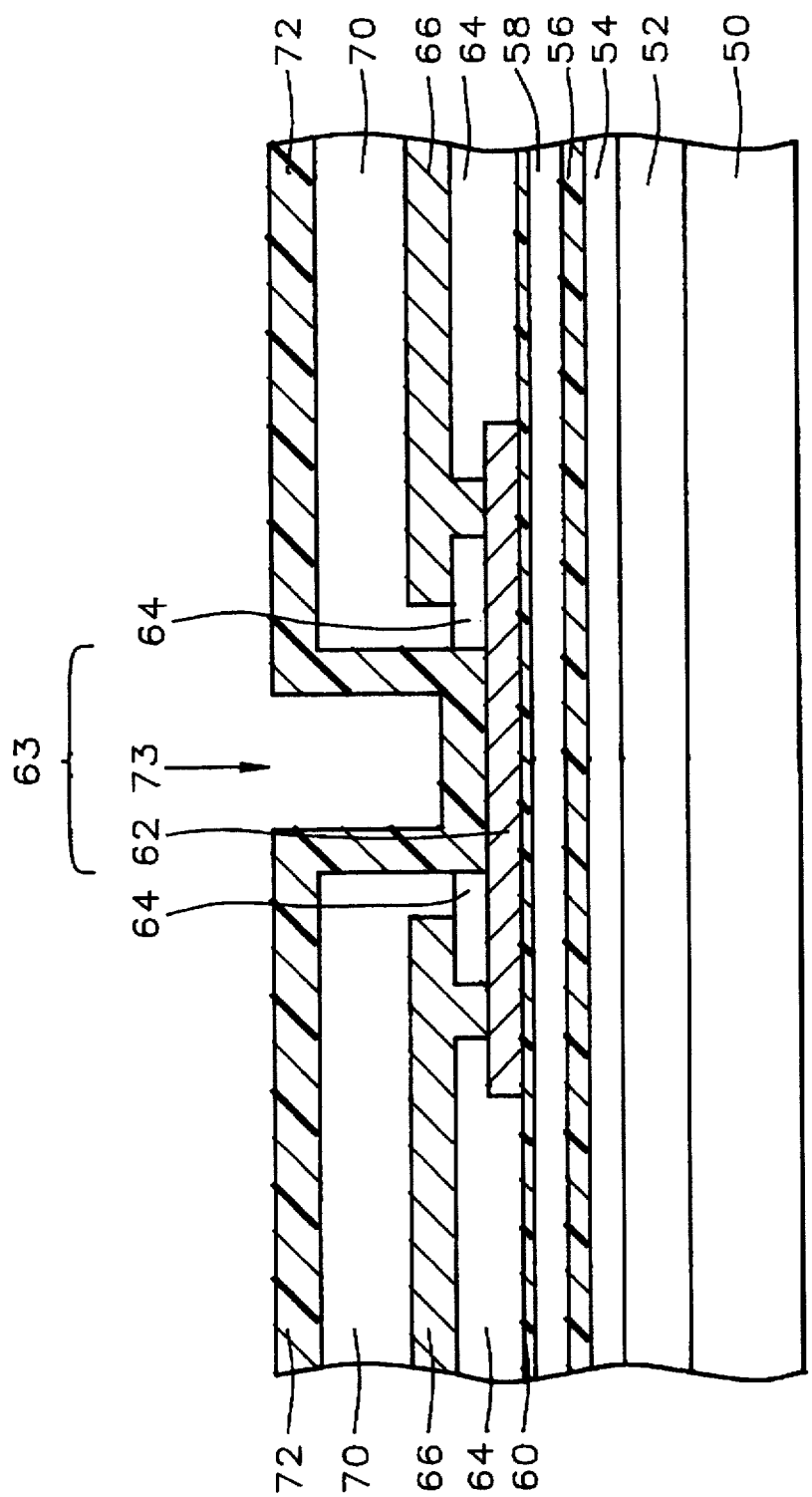
FIG. 8 is a simplified cross sectional view take along axis A/A' in FIG. 1B that illustrates another embodiment of method for forming the moisture barrier system of the present invention.

FIG. 8 shows a simplified structure of the moisture barrier system of the present invention. Layer 52 represents insulation layers underlying the first barrier layer 56. Layer 52 could comprise any number of layers. Also, layer 58 represents the insulating layers between the first and second barrier layers 56 60. Likewise layer 70 represents any number of insulating and conductive layers under the third barrier layer 72.

FIG. 7 shows that the diffusion path for moisture/ contamination (e.g., $H_2O$) is contained by the three moisture barriers 56 60 72 of the present invention. As shown in FIG. 7, the fuse 62 is burned by a laser and forms a hole (laser repair hole) 76 in the third barrier layer 72, and the fuse 62. The hole 76 could extend through the second barrier layer 60 and the first barrier layer 56. As shown by the dotted lines of the moisture path, the first and second barriers 56 60, create a closed area where the moisture and contamination can't diffuse up into both the upper layers 64 68 70 and the lower layers 50 52 54 and affect the product devices. This moisture barriers 56 60 72 will increase yields by reducing metal corrosion, insulating/dielectric layer peeling, and contamination, especially mobile ions.

While the invention has been particularly shown and described with reference to the preferred embodiments thereof, it will be understood by those skilled in the art that various changes in form and details may be made without departing from the spirit and scope of the invention. For example, it would be obvious to one skilled in the art that the number and combination of insulating and dielectric layers could be varied without effecting the function of the present invention.

What is claimed is:

1. A method of forming a moisture barrier system for an integrated circuit on a substrate; said substrate having a fuse window area and device areas; comprising the steps of:
   a) forming an insulating layer over portions of said substrate including in said fuse window area;
   b) forming a first barrier layer composed of a moisture impervious material over said insulating layer and said substrate;
   c) forming a first interlevel dielectric layer over said first barrier layer;
   d) forming a second barrier layer composed of a moisture impervious material over said first interlevel dielectric layer;
   e) forming a fuse over said second barrier layer at least across said fuse window area; and
   f) forming insulating and conductive layers over said fuse and forming a fuse window through said insulating and conductive layers.

2. The method of claim 1 which further includes said fuse window having sidewalls, and said fuse window exposing portions of said fuse; and forming a third barrier layer composed of a moisture impervious material over said first barrier layer and over said sidewalls of said fuse window and said exposed portions of said fuse.

3. The method of claim 2 wherein said third barrier layer is composed of silicon nitride and has a thickness in the range of between about 5000 and 10,000 Å.

4. The method of claim 1 wherein said insulating layer is composed of a field oxide region and a silicon oxide insulating layer; and said field oxide region has a thickness in the range of between about 3000 and 5000 Å.

5. The method of claim 1 wherein said first barrier layer is composed of a three film structure of silicon oxide/silicon nitride/silicon oxide and has an overall thickness in the range of between about 300 and 600 Å.

6. The method of claim 1 wherein said first barrier layer is composed of silicon nitride and has an overall thickness in the range of between about 200 and 500 Å.

7. The method of claim 1 wherein said first interlevel dielectric layer is composed of borophosphosilicate glass (BPSG) and has a thickness in the range between about 3000 and 5000 Å.

8. The method of claim 1 wherein said second barrier layer is composed of silicon nitride and has thickness in the range between about 200 and 500 Å.

9. The method of claim 1 wherein said fuse is composed of a material selected from the group consisting of: polysilicon, polycide, and silicide.

10. The method of claim 1 wherein the forming of said insulating and conductive layers comprises:
   a) forming a second interlevel dielectric layer over said fuse and said second barrier layer; and patterning said second interlevel dielectric layer to form vias exposing said fuse;
   b) forming a first metal layer over said second interlevel dielectric layer and in said vias;
   c) forming an inter metal dielectric layer and a first passivation layer over said first metal layer;
   d) etching a fuse window though said second interlevel dielectric, said inter metal dielectric layer, and said first passivation layer to expose portions of said fuse and said first barrier layer in said fuse window area; said fuse window having vertical sidewalls; and
   e) forming a third barrier layer over said first passivation layer and over the sidewalls of said fuse window and said portion of said exposed fuse; said third barrier layer forming a moisture proof seal with said first barrier layer.

11. A method of forming a moisture barrier for an integrated circuit on a substrate; said substrate having a fuse window area and device areas; comprising the steps of:
   a) forming a field oxide region over portions of said substrate including said fuse window area;
   b) forming a first insulating layer over said field oxide layer and said substrate;

c) forming a first barrier layer composed of silicon nitride over said first insulating layer;

d) forming a first interlevel dielectric layer over said first barrier layer;

e) forming a second barrier layer composed of silicon nitride over said first interlevel dielectric layer;

f) forming a fuse over said second barrier layer at least across said fuse window area;

g) forming a second interlevel dielectric layer over said fuse and said second barrier layer; and patterning said second interlevel dielectric layer to form vias exposing said fuse;

h) forming a first metal layer over said second interlevel dielectric layer and in said vias;

i) forming an inter metal dielectric layer and a first passivation layer over said first metal layer;

j) etching a fuse window though said second interlevel dielectric layer, said inter metal dielectric layer, and said first passivation layer to expose portions of said fuse in said fuse window area; said fuse window having vertical sidewalls; and k) forming a third barrier layer composed of silicon nitride over said first passivation layer and over said sidewalls of said fuse window and said portions of said exposed fuse; said third barrier layer forming a moisture proof seal with said first barrier layer.

12. The method of claim 11 wherein said field oxide region has a thickness in the range of between about 3000 and 5000 Å.

13. The method of claim 11 wherein said first insulating layer is formed of silicon oxide formed using tetraethylorthosilicate and has a thickness in the range of between about 1000 and 2000 Å.

14. The method of claim 11 wherein said first barrier layer is composed of a three film structure of silicon oxide/silicon nitride/silicon oxide and has an overall thickness in the range of between about 300 and 600 Å.

15. The method of claim 11 wherein said first interlevel dielectric layer is composed of borophosphosilicate glass (BPSG) and has a thickness in the range between about 3000 and 5000 Å.

16. The method of claim 11 wherein said second barrier layer (SiN) is composed of silicon nitride and has thickness in the range between about 200 and 500 Å.

17. The method of claim 11 wherein said fuse is composed of a material selected from the group consisting of polysilicon, tungsten silicide, and polycide.

18. The method of claim 11 wherein said second interlevel dielectric layer is composed of borophosphosilicate glass (BPSG) and has a thickness in the range between about 3000 and 5000 Å.

19. The method of claim 11 wherein said first metal layer 66 is composed of a four film structure consisting of (1) a first titanium layer, (2) a titanium nitride layer, (3) an aluminum silicon copper layer and (4) an anti-reflective coating (ARC) titanium nitride layer and has an overall thickness in the range between about 4000 and 7000 Å.

20. The method of claim 11 wherein said inter metal dielectric layer 68 is composed of a three layer sandwich structure of silicon oxide, spin on glass and silicon oxide; and has an overall thickness in the range of between about 3000 and 5000 Å; and said first passivation layer 70 is composed of silicon oxide and has a thickness in the range between about 1000 and 3000 Å.

21. The method of claim 11 wherein said third barrier layer 72 is composed of silicon nitride and has a thickness in the range between about 5000 and 10,000 Å.

* * * * *